US009922708B1

(12) United States Patent
Hong

(10) Patent No.: US 9,922,708 B1
(45) Date of Patent: Mar. 20, 2018

(54) VOLTAGE CONTROLLING CIRCUIT

(71) Applicant: SK hynix Inc., Icheon-si, Gyeonggi-do (KR)

(72) Inventor: Yun Seok Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/404,829

(22) Filed: Jan. 12, 2017

(30) Foreign Application Priority Data

Sep. 19, 2016 (KR) ........................ 10-2016-0119542

(51) Int. Cl.
*G11C 13/00* (2006.01)
*H01L 45/00* (2006.01)

(52) U.S. Cl.
CPC ...... *G11C 13/0004* (2013.01); *G11C 13/0023* (2013.01); *G11C 13/0069* (2013.01); *H01L 45/06* (2013.01); *H01L 45/1233* (2013.01); *H01L 45/1253* (2013.01); *H01L 45/141* (2013.01)

(58) Field of Classification Search
CPC ............................ G11C 5/147; G11C 13/0069
USPC .................................................. 365/163, 226
See application file for complete search history.

(56) References Cited

U.S. PATENT DOCUMENTS

| | | | | | |
|---|---|---|---|---|---|
| 5,543,737 | A * | 8/1996 | Ovshinsky | ............. | H03K 19/02 257/4 |
| 5,714,768 | A * | 2/1998 | Ovshinsky | ............. | G11C 11/56 257/4 |
| 2004/0114413 | A1* | 6/2004 | Parkinson | .......... | G11C 13/0004 365/100 |
| 2009/0244796 | A1* | 10/2009 | Tang | .................... | H01L 27/0251 361/56 |
| 2009/0310402 | A1* | 12/2009 | Parkinson | .......... | G11C 13/0004 365/163 |
| 2011/0149628 | A1* | 6/2011 | Langtry | ............. | G11C 13/0069 365/51 |
| 2012/0241705 | A1* | 9/2012 | Bresolin | ................. | H01L 45/06 257/2 |
| 2013/0294152 | A1* | 11/2013 | Kau | ....................... | H01L 45/06 365/163 |
| 2014/0061575 | A1* | 3/2014 | Pio | .......................... | H01L 27/10 257/5 |
| 2017/0076794 | A1* | 3/2017 | Zeng | .................... | G11C 13/004 |

FOREIGN PATENT DOCUMENTS

KR 100433618 B1 5/2004

* cited by examiner

*Primary Examiner* — Michael Tran
(74) *Attorney, Agent, or Firm* — William Park & Associates Ltd.

(57) ABSTRACT

A voltage controlling circuit may include a first voltage terminal, a second voltage terminal and a plurality of Ovonic threshold switch (OTS) units. The second voltage terminal may have a voltage different from that of the first voltage terminal. The OTS devices may be connected between the first voltage terminal and the second voltage terminal. The OTS units may be serially connected with each other.

18 Claims, 4 Drawing Sheets

VOLTAGE CONTROLLING CIRCUIT

CROSS-REFERENCES TO RELATED APPLICATION

The present application claims priority under 35 U.S.C. § 119(a) to Korean application number 10-2016-0119542, filed on Sep. 19, 2016, in the Korean Intellectual Property Office, which incorporated herein by reference in its entirety.

BACKGROUND

1. Technical Field

Various embodiments generally relate to a semiconductor integrated circuit device, and more particularly, to a voltage controlling circuit using an Ovonic threshold switch (OTS).

2. Related Art

A semiconductor integrated circuit device may include a voltage controlling circuit configured to receive a power supply voltage and to convert the power supply voltage into an internal voltage. The voltage controlling circuit may drop or divide the power supply voltage using a circuit-element, such as a resistance, to generate a voltage suitable for operating an internal circuit. Further, the voltage controlling circuit may adjust an abnormal voltage in the power supply voltage to a voltage. The adjusted voltage may be provided to the internal circuit.

SUMMARY

According to an embodiment, there may be provided a voltage controlling circuit. The voltage controlling circuit may include a first voltage terminal, a second voltage terminal and a plurality of Ovonic threshold switch (OTS) units. The second voltage terminal may have a voltage different from that of the first voltage terminal. The OTS devices may be connected between the first voltage terminal and the second voltage terminal. The OTS units may be serially connected with each other.

According to an embodiment, there may be provided a voltage controlling circuit. The voltage controlling circuit may include a first voltage terminal, a second voltage terminal, a plurality of Ovonic threshold switch (OTS) units and a plurality of switches. The second voltage terminal may have a voltage different from that of the first voltage terminal. The OTS units may be connected between the first voltage terminal and the second voltage terminal. The OTS devices may be serially connected with each other. The switches may be configured to selectively drive the OTS units.

DETAILED DESCRIPTION

Figure 1:
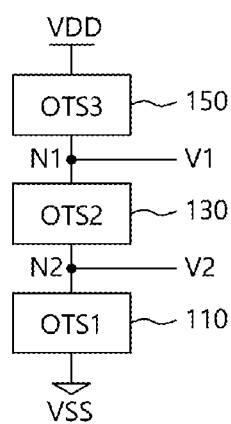
FIG. 1 is a circuit diagram illustrating a voltage controlling circuit in accordance with example embodiments.

Various example embodiments will be described hereinafter with reference to the accompanying drawings, in which some examples of the embodiments are illustrated. The embodiments may, however, be embodied in many different forms and should not be construed as limited to the examples set forth herein. Rather, these examples of embodiments are provided so that this disclosure will be thorough and complete, and will fully convey a scope of the present disclosure to those skilled in the art. In the drawings, the sizes and relative sizes of layers and regions may be exaggerated for clarity.

It will be understood that when an element or layer is referred to as being "on," "connected to," or "coupled to" another element or layer, the element can be directly on, connected or coupled to the other element or layer or intervening elements or layers may be present. In contrast, when an element is referred to as being "directly on," "directly connected to," or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer or section discussed below could be termed a second element, component, region, layer, or section without departing from the teachings of the present disclosure.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "under" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure applies. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a circuit diagram illustrating a voltage controlling circuit in accordance with example embodiments.

Referring to FIG. 1, a voltage controlling circuit 100 of this example embodiment may include a first voltage terminal, a second voltage terminal, and a plurality of Ovonic threshold switch (OTS) units 110, 130 and 150.

The first voltage terminal may correspond to a power supply voltage terminal VDD. The second voltage terminal may correspond to a ground voltage terminal VSS. In order to drive the OTS units 110, 130 and 150, a voltage difference may be formed between the first voltage terminal VDD and the second voltage terminal VSS. For example, the voltage difference between the first voltage terminal VDD and the second voltage terminal VSS may be greater than a total sum of threshold voltages of the OTS units 110, 130 and 150.

The OTS units 110, 130 and 150 may be connected in series with each other between the first voltage terminal VDD and the second voltage terminal VSS. In example embodiments, the first to third OTS units 110, 130 and 150 may be sequentially connected with each other between the first voltage terminal VDD and the second voltage terminal VSS.

Figure 2:
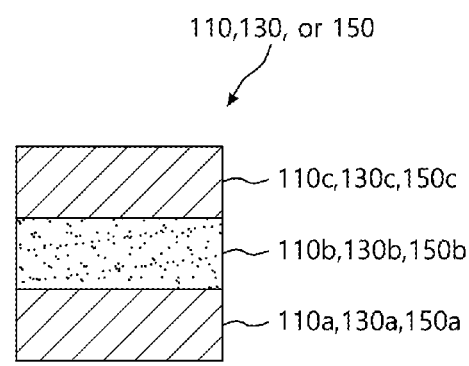
FIG. 2 is a cross-sectional view illustrating an OTS device in accordance with example embodiments.

FIG. 2 is a cross-sectional view illustrating an OTS device in accordance with example embodiments.

Referring to FIG. 2, each of the OTS units 110, 130 and 150 may include a lower electrode 110a, 130a and 150a, a phase changeable layer 110b, 130b and 150b and an upper electrode 110c, 130c and 150c. The phase changeable layer 110b, 130b and 150b may include chalcogenide material to form a chalcogenide layer. The phase changeable layer 110b, 130b and 150b may be formed on the lower electrode 110a, 130a and 150a. The upper electrode 110c, 130c and 150c may be formed on the phase changeable layer 110b, 130b and 150b. The OTS units 110, 130 and 150 may use characteristics of the chalcogenide material for on/off operations. When a voltage or a current, which is substantially equal to or higher than a threshold voltage or a threshold current of the chalcogenide, is applied to the upper electrode 110c, 130c and 150c or the lower electrode 110a, 130a and 150a, the phase changeable layer 110b, 130b and 150b may have a switching characteristic in which a state having a high resistance (an amorphous state or an insulating state) may be induced to have a conductive state having a low resistance. Because the OTS units 110, 130 and 150 may have the above-mentioned chalcogenide characteristics, the OTS units 110, 130 and 150 may provide a rapid switching characteristic and may provide a reproducible switch.

The phase changeable layer 110b, 130b and 150b may include a chalcogenide element and at least one chemical or modifying element. For example, the phase changeable layer 110b, 130b and 150b may include tellurium (Te), selenium (Se) or sulfur (S) in group VI. The modifying element may include gallium (Ga), aluminum (Al) or indium (In) in group III or phosphorous (P), arsenic (As) or antimony (Sb) in group V. A composition ratio of the above-mentioned elements and a thickness of the phase changeable layer 110b, 130b and 150b may represent various resistances.

The first to third OTS units 110, 130 and 150 may be driven by voltages of the first voltage terminal VDD and the second voltage terminal VSS where the first to third OTS units 110, 130 and 150 may be driven as resistors. The first to third OTS units 110, 130 and 150 may have different resistances in accordance with the thicknesses of the phase changeable layers 110b, 130b and 150b.

Because the first to third OTS units 110, 130 and 150 may be driven as resistors, a first dividing voltage V1 may be obtained from a first connection node N1 disposed between the second OTS unit 130 and the third OTS unit 150. A second dividing voltage V2 may be obtained from a second connection node N2 disposed between the first OTS unit 110 and the second OTS unit 130. For example, the first and second dividing voltages V1 and V2 may be obtained from following equations.

$$V1 = VDD \times \{(R_{OTS2} + R_{OTS1})/(R_{OTS3} + R_{OTS2} + R_{OTS1})\}$$

$$V2 = VDD \times \{R_{OTS1}/(R_{OTS3} + R_{OTS2} + R_{OTS1})\}$$

Figure 3:
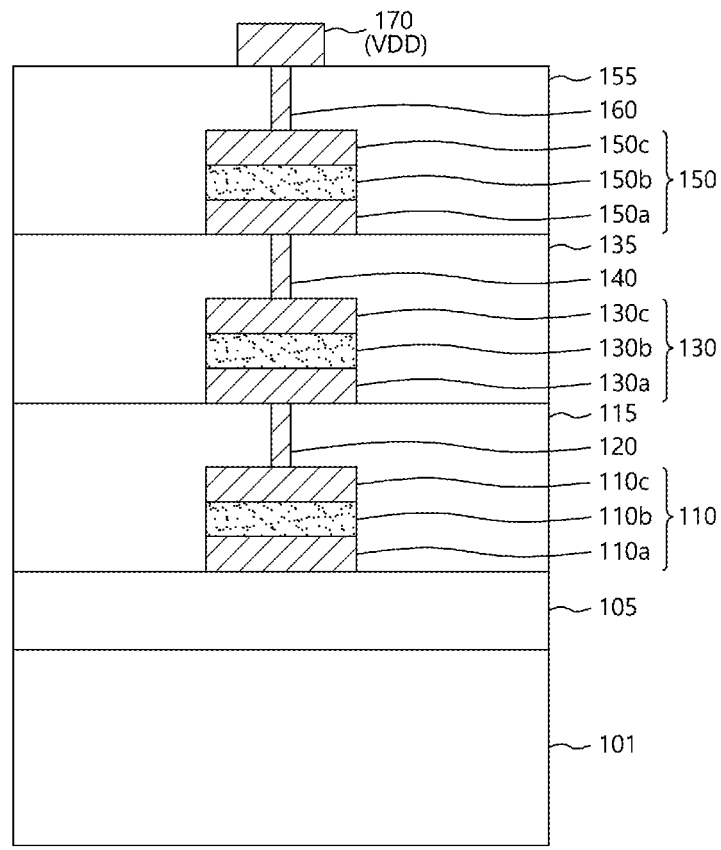
FIG. 3 is a cross-sectional view illustrating serially connected OTS devices on a semiconductor substrate in accordance with example embodiments.

FIG. 3 is a cross-sectional view illustrating serially connected OTS devices on a semiconductor substrate in accordance with example embodiments.

Referring to FIG. 3, the first to third OTS units 110, 130 and 150 may be stacked on a semiconductor substrate 101. Insulating layers 105, 115, 135 and 155 may be interposed between the semiconductor substrate 101 and the first OTS unit 110, and between the OTS units 110, 130 and 150. The first to third OTS units 110, 130 and 150 may be sequentially connected and electrically coupled with each other through contact plugs 120, 140 and 160 to form the serially connected OTS units 110, 130 and 150. Because the serially connected OTS units 110, 130 and 150 may be stacked on the semiconductor substrate 101, the OTS units 110, 130 and 150 may have an area smaller than that of a resistor constituting of a polysilicon wiring. Further, because the OTS units 110, 130 and 150 may have a rapid switching speed compared with the resistor constituting of the polysilicon wiring, the various dividing voltages may be obtained in a short time.

Figure 4:
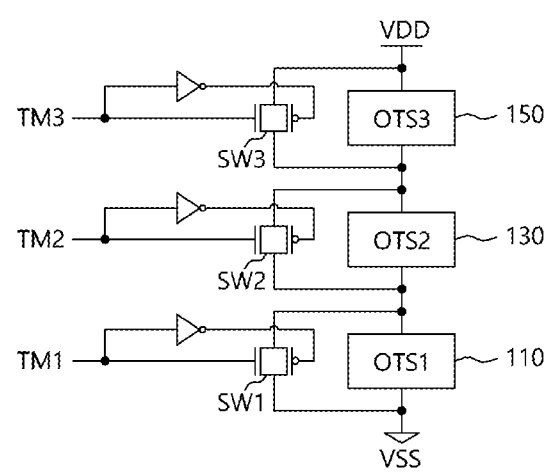
FIG. 4 is a circuit diagram illustrating a voltage controlling circuit in accordance with example embodiments.

FIG. 4 is a circuit diagram illustrating a voltage controlling circuit in accordance with example embodiments.

Referring to FIG. 4, a voltage controlling circuit 100a of this example embodiment may include switches SW1, SW2 and SW3 coupled in parallel to the OTS units 110, 130 and 150, respectively. The switches SW1, SW2 and SW3 may correspond to a transmission gate driven in response to switch control signals TM1, TM2 and TM3. The switches SW1, SW2 and SW3 may be configured to control the OTS units 110, 130 and 150. Current paths of the OTS units 110, 130 and 150 may be decided by selective operations of the switches SW1, SW2 and SW3.

Figure 5:
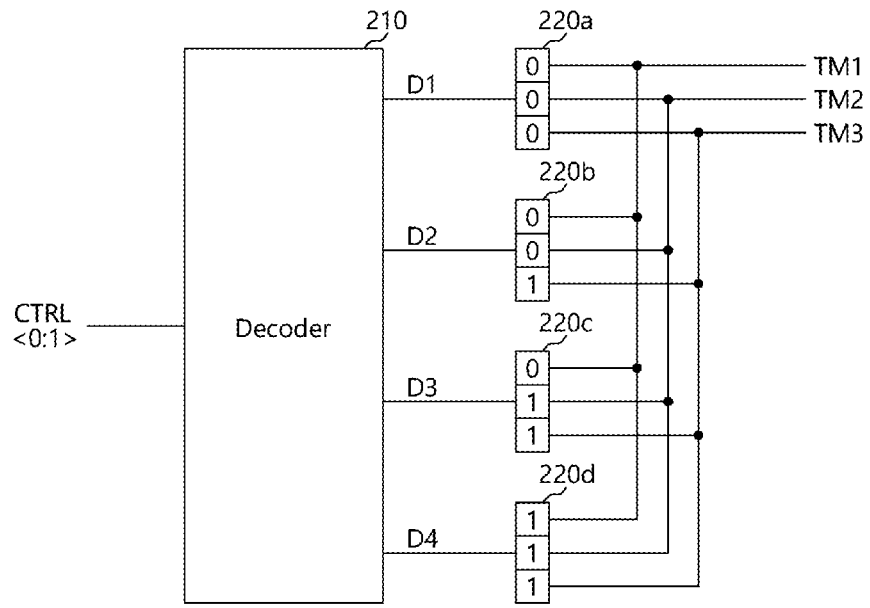
FIG. 5 is a circuit diagram illustrating a control signal generating circuit in accordance with example embodiments.

FIG. 5 is a circuit diagram illustrating a control signal generating circuit in accordance with example embodiments.

Referring to FIG. 5, the switch control signals TM1, TM2 and TM3 may be generated from a control signal generating circuit 200.

The control signal generating circuit 200 may include a decoder 210 and first to fourth storage units 220a, 220b, 220c and 220d.

The decoder 210 may be configured to receive a 2-bit input control signal CTRL<0:1> and to output first to fourth decoding signals D1, D2, D3 and D4.

For example, the first storage unit 220a may be configured to store information such as a value (0,0,0). The second storage unit 220b may be configured to store information such as a value (0,0,1). The third storage unit 220c may be configured to store information such as a value (0,1,1). The fourth storage unit 220d may be configured to store information such as a value (1,1,1). The first to fourth storage units 220a, 220b, 220c and 220d may include a fuse structure or a latch circuit.

The first to fourth decoding signals D1, D2, D3 and D4 may be connected to the first to fourth storage units 220a, 220b, 220c and 220d, respectively. Any one of the values may be selected from information in the first to fourth storage units 220a, 220b, 220c and 220d in accordance with enabled decoding signals D1, D2, D3 and D4 may be outputted as the switching control signals TM1, TM2 and TM3. In other words, the first to fourth storage units 220a, 220b, 220c and 220d may receive the decoding signals D1, D2, D3 and D4 to store on/off information of the OTS units 110, 130 and 150.

For example, when the switching control signal TM3 is enabled to high, the switch SW3 is turned-on. Then, a current of the first voltage terminal VDD flows through the switch SW3 without passing the third OTS unit 150, because a resistance of the third OTS unit is higher than that of the switch SW3 turned-on. Meanwhile, when the switching control signal TM3 is disabled to low, the switch SW3 is turned-off. Then, the current of the first voltage terminal VDD flows through the third OTS unit 150 without passing through the switch SW3, because a resistance of the turned-off switch SW3 is higher than that of the third OTS unit 150. Accordingly, the serially connected OTS units 110, 130 and 150 may be selectively driven wholly or partially in a similar manner so that the power supply voltage may be dropped to a desired voltage.

Figure 6:
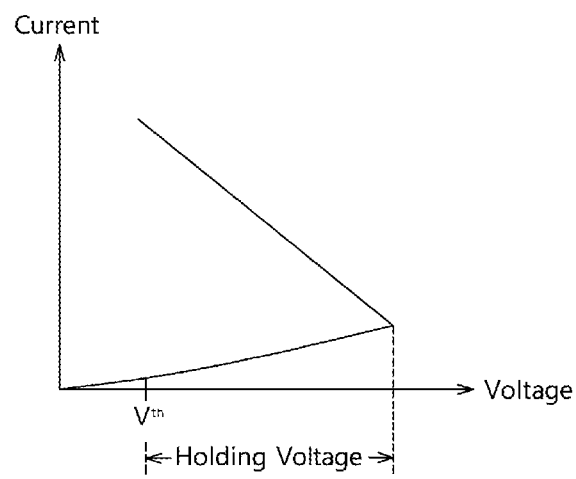
FIG. 6 is a graph showing current-voltage characteristics of an OTS device in accordance with example embodiments.

FIG. 6 is a graph showing current-voltage characteristics of an OTS device in accordance with example embodiments.

Referring to FIG. 6, the OTS units 110, 130 and 150 may have a snap back. That is, the OTS units 110, 130 and 150 may be maintained in "off" state, for example, a non-conductive state, in response to a voltage lower than a critical voltage Vth. The OTS units 110, 130 and 150 may be snapped back to "on" state in response to a voltage higher than the threshold voltage Vth. That is, the OTS units 110, 130 and 150 having the "on" state may transmit a great amount of the current using a voltage characteristic in which a holding voltage level may be still maintained. Thus, the voltage may be rapidly dropped to the desired voltage.

Figure 7:
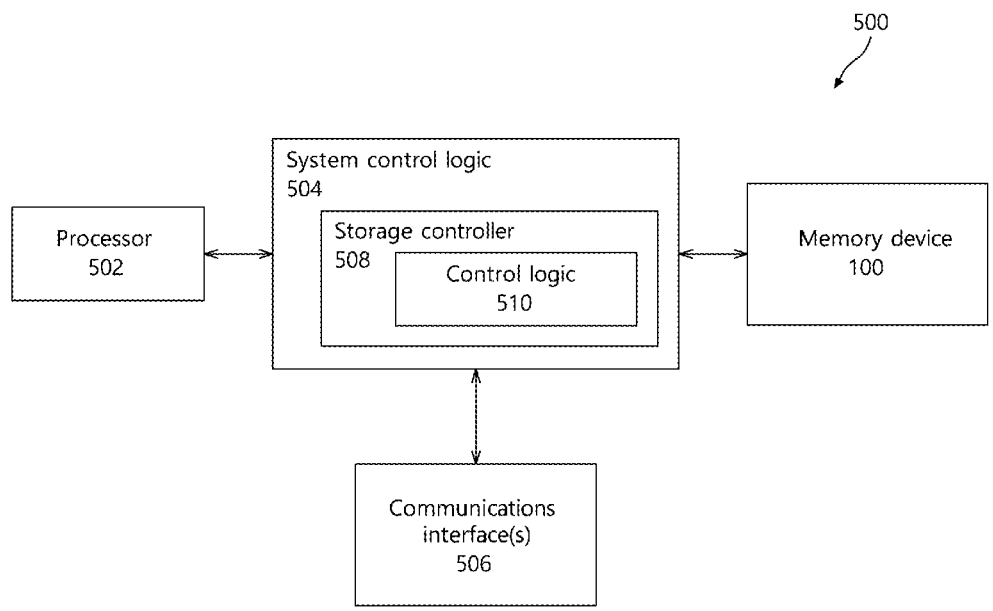
FIG. 7 is a block diagram illustrating a system in accordance with example embodiments.

FIG. 7 is a block diagram illustrating a system in accordance with example embodiments.

Referring to FIG. 7, a system 500 may include a system control logic 504, the semiconductor integrated circuit device 100 and at least one communication interface 506. The system control logic 504 may be connected with at least one of processors 502. The semiconductor integrated circuit device 100 may be connected with the system control logic 504. The communication interface 506 may be connected with the system control logic 504.

The communication interface 506 may provide an interface for the system 500 to communicate with devices through at least one network. The communication interface 506 may include hardware and/or a firmware. In example embodiments, the communication interface 506 may include a network adaptor, a wireless network adaptor, a telephone modem and/or a wireless modem. The communication interface 506 may use at least one antenna for wireless communication.

At least one of the processors 502 may be packed with a logic for at least one controller of the system control logic 504. In example embodiments, the processor 502 may be packed with the logic for the controller of the system control logic 504 to form a system in package (SIP).

In example embodiments, at least one of the processors 502 may be arranged on a die in which the logic for the controller of the system control logic may be installed.

In example embodiments, at least one of the processors 502 may be arranged on the die in which the logic for the controller of the system control logic may be installed to form a system on chip (SOC).

In example embodiments, the system control logic 504 may include interface controllers configured to provide interfaces to a device or a component communicating with at least one of the processors 502 and/or the system control logic 504.

In example embodiments, the system control logic 504 may include a storage controller 508 configured to provide the semiconductor integrated circuit device 100 with interfaces for controlling various access operations such as a set operation, a reset operation, a read operation, etc. The storage controller 508 may include a control logic 510 configured to control the semiconductor integrated circuit device 100. The control logic 510 may additionally generate various selection signals for controlling drivers, level shifters, global selectors, etc. When the control logic 510 is operated by at least one of the processors 502, the control logic 510 may include commands stored in a computer readable medium for performing the above-mentioned operations of the storage controller 508.

In example embodiments, the system 500 may include a desktop computing device, laptop computing device, a mobile computing device such as a smart phone, a tablet, etc. The system 500 may further include components and/or different architectures.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A voltage controlling circuit comprising:
    a first voltage terminal;
    a second voltage terminal having a voltage different from that of the first voltage terminal; and
    a plurality of Ovonic threshold switch (OTS) units connected between the first voltage terminal and the second voltage terminal, the OTS units being connected with each other in series,
    wherein the OTS units are sequentially stacked on a semiconductor substrate and the OTS units on the semiconductor substrate are electrically coupled with each other via contact plugs.

2. The voltage controlling circuit of claim 1, wherein the voltage difference between the first voltage terminal and the second voltage terminal is greater than a total sum of threshold voltages of the OTS units.

3. The voltage controlling circuit of claim 1, wherein each of the OTS units comprises:
    a first electrode;

a chalcogenide layer formed on the first electrode; and
a second electrode formed on the chalcogenide layer.

4. The voltage controlling circuit of claim 3, wherein each of the OTS units has a different resistance where the resistance of each OTS unit varies according to a thickness of the chalcogenide layer of each OTS unit.

5. The voltage controlling circuit of claim 3, further comprising an insulating layer interposed between a semiconductor substrate and a first OTS unit, and between the remaining OTS units.

6. The voltage controlling circuit of claim 1, wherein voltage output nodes are provided to connection nodes disposed between the OTS units.

7. The voltage controlling circuit of claim 1, further comprising a plurality of switches configured to control the plurality of OTS units, respectively,
wherein the plurality of switches are connected to the plurality of OTS units in parallel, respectively.

8. The voltage controlling circuit of claim 7, wherein the plurality of switches comprise a plurality of transmission gates configured to be driven by a plurality of switch control signals, respectively.

9. The voltage controlling circuit of claim 7, wherein a current of the first voltage terminal flows through a switch, coupled in parallel with an OTS unit, and not through the OTS unit because a resistance of the OTS unit is higher than that of the switch when the switch is turned on.

10. The voltage controlling circuit of claim 7, further comprising a control signal generating circuit configured to generate the plurality of switch control signals for driving the switches,
wherein the control signal generating circuit comprises:
a decoder configured to receive an input control signal and to output decoding signals; and
a plurality of storage units configured to receive the decoding signals to store on/off information of the plurality of OTS units.

11. A voltage controlling circuit comprising:
a first voltage terminal;
a second voltage terminal having a voltage different from that of the first voltage terminal;
a plurality of Ovonic threshold switch (OTS) units connected between the first voltage terminal and the second voltage terminal, the OTS units being connected with each other in series; and
a plurality of switches configured to selectively drive the plurality of OTS units,
wherein the plurality of switches are connected to the plurality of OTS units in parallel, respectively.

12. The voltage controlling circuit of claim 11, wherein the plurality of switches comprise a plurality of transmission gates configured to be driven by a plurality of switch control signals, respectively.

13. The voltage controlling circuit of claim 12, further comprising a control signal generating circuit configured to generate the switch control signals,
wherein the control signal generating circuit comprises:
a decoder configured to receive an input control signal and to output decoding signals; and
a plurality of storage units configured to receive the decoding signals to store on/off information of the plurality of OTS units.

14. The voltage controlling circuit of claim 11, wherein the voltage difference between the first voltage terminal and the second voltage terminal is greater than a total sum of threshold voltages of the plurality of OTS units.

15. The voltage controlling circuit of claim 11, wherein each of the OTS units comprises:
a first electrode;
a chalcogenide layer formed on the first electrode; and
a second electrode formed on the chalcogenide layer.

16. The voltage controlling circuit of claim 15, wherein the OTS units have different resistances where the resistance of each OTS unit is in accordance with a thickness of the chalcogenide layer of each OTS unit.

17. The voltage controlling circuit of claim 11, wherein the OTS units are sequentially stacked on a semiconductor substrate.

18. The voltage controlling circuit of claim 11, wherein the OTS units on the semiconductor substrate are electrically coupled with each other via contact plugs.

* * * * *